United States Patent
Nam

(10) Patent No.: US 8,471,318 B2
(45) Date of Patent: Jun. 25, 2013

(54) SEMICONDUCTOR DEVICE AND METHOD FOR FORMING USING THE SAME

(75) Inventor: Byung Sub Nam, Cheongju-si (KR)

(73) Assignee: Hynix Semiconductor Inc., Icheon (KR)

(*) Notice: Subject to any disclaimer, the term of this patent is extended or adjusted under 35 U.S.C. 154(b) by 0 days.

(21) Appl. No.: 13/176,616

(22) Filed: Jul. 5, 2011

(65) Prior Publication Data

US 2011/0260328 A1 Oct. 27, 2011

Related U.S. Application Data

(62) Division of application No. 12/495,584, filed on Jun. 30, 2009, now Pat. No. 7,998,870.

(30) Foreign Application Priority Data

Apr. 8, 2009 (KR) .................. 10-2009-0030347

(51) Int. Cl.
*H01L 27/108* (2006.01)
*H01L 29/94* (2006.01)

(52) U.S. Cl.
USPC ..................................... 257/296; 257/208

(58) Field of Classification Search
USPC ............ 257/68, 71, 202, 208, 210, 784, 786, 257/E21.657, E21.658, E27.084, E21.646, 257/906, 296

See application file for complete search history.

(56) References Cited

U.S. PATENT DOCUMENTS

| | | | | |
|---|---|---|---|---|
| 2008/0160740 | A1* | 7/2008 | Ahn et al. | 438/586 |
| 2009/0085083 | A1* | 4/2009 | Shin | 257/297 |
| 2010/0227463 | A1* | 9/2010 | Cho | 438/586 |

FOREIGN PATENT DOCUMENTS

| | | |
|---|---|---|
| JP | 08-335633 A | 12/1996 |
| JP | 2003-273242 A | 9/2003 |
| KR | 1020040006500 A | 1/2004 |
| KR | 1020090034171 A | 4/2009 |

* cited by examiner

*Primary Examiner* — Sheila V Clark

(57) ABSTRACT

A semiconductor device and a method for forming the same are disclosed. The semiconductor device includes a plurality of bit lines having a uniform width on a semiconductor substrate, an active region obliquely arranged to have a predetermined angle with respect to the bit lines, a spacer arranged around the bit lines connected to a center part of the active region. A contact pad is connected to a lower part of the bit lines. The spacer is formed not only at an upper part of sidewalls of the contact pad but also at sidewalls of the bit lines. As a result, a CD of the bit line contact increases, so that a bit line contact patterning margin also increases. A bit line pattern having a uniform width is formed so that a patterning margin increases. A storage electrode contact self-alignment margin increases so that a line-type storage electrode contact margin increases.

15 Claims, 8 Drawing Sheets

SEMICONDUCTOR DEVICE AND METHOD FOR FORMING USING THE SAME

CROSS-REFERENCE TO RELATED APPLICATION

The priority of Korean patent application No. 10-2009-0030347 filed on Apr. 8, 2009, the disclosure of which is hereby incorporated in its entirety by reference, is claimed.

BACKGROUND OF THE INVENTION

The present invention relates to a method for forming a semiconductor device, and more particularly to a semiconductor device and a method for forming the same, which reduces a defective pattern from occurring in bit lines that have different widths so as to accurately connect a bit line to a bit line contact and to increase a margin of a storage electrode contact.

In recent times, the demand for implementing a high-capacity dynamic random access memory (DRAM) has rapidly increased. However, there is difficulty in increasing a chip size, resulting in a limitation in increasing storage capacity of the DRAM. The larger the chip size, the fewer the number of chips on each wafer, resulting in a reduction in productivity. Therefore, in recent times, many researchers are conducting intensive research into a method for reducing a cell region by varying a cell layout so as to form a large number of memory cells on one wafer. By such efforts, a semiconductor layout is rapidly changing from a $8F^2$-layout to a $6F^2$-layout.

A $6F^2$-layout device means a semiconductor device having a $6F^2$-sized unit cell in which the length in the direction of a bit-line is 3F and the length in the direction of a word-line is 2F such that a total area of $6F^2$ is given. Therefore, as the unit-cell area is rapidly changing from $8F^2$ to $6F^2$, the degree of integration is also increasing. Each of the DRAM devices based on the $6F^2$ layout has an oblique active shape A, and two unit cells are generally formed in one active region. Two storage electrode contact plugs are arranged between bit lines, and pass through a bit line contact in the active region, such that the $6F^2$-layout DRAM device has a higher degree of integration than the $8F^2$-layout DRAM device.

FIG. 1A is a plan view illustrating a conventional semiconductor device, and FIG. 1B is a cross-sectional view illustrating the semiconductor device taken along the line X-X' of FIG. 1A.

Referring to FIG. 1A, a $6F^2$-layout cell region includes a plurality of active regions A arranged to have a predetermined angle with respect to a bit line 18, a plurality of word liens (not shown) spaced apart from each other at intervals of 1F, and a plurality of bit lines 18 formed on the word lines while being spaced apart from each other at intervals of 1F.

In more detail, if a cross-sectional view is taken along line X-X' in the semiconductor device of FIG. 1A, FIG. 1B is obtained.

Referring to FIG. 1B, the conventional semiconductor device includes an interlayer insulating layer 14 formed on a semiconductor substrate 10 having an active region defined by a device isolation layer 12, a bit line contact hole 16 formed in the interlayer insulating layer 14, and a bit line 18 burying the bit line contact hole 16. In this case, a word line, a landing plug, and an interlayer insulating layer may be further formed on the semiconductor substrate 10, and a detailed description thereof will be omitted herein for convenience of description.

The bit line 18 illustrated in FIG. 1A has a non-uniform width, and is designed to have a larger width where the bit line contact hole 16 is located. This is done so that the bit line can completely cover the bit line contact hole 16. Therefore, the width of the bit line 18 according to the related art is not set to the same value in all regions, and has different widths according to the presence or absence of the bit line contact hole 16.

However, it is difficult to implement the above-mentioned pattern. Particularly, in order to implement an exposure mask for defining the above-mentioned pattern, a semiconductor device must be designed in units of a small-sized segments. This requires a much longer production time and results in an increase in production cost. Although if it is assumed that the above-mentioned pattern is implemented on an exposure mask, it is difficult to perform patterning based on this pattern due to the reduction of a process margin.

FIG. 2 illustrates a patterning image based on a bit line exposure mask according to the related art.

As can be seen from FIG. 2, a pattern, in which a plurality of narrow-width parts and a plurality of wide-width parts are repeatedly arranged, has a very low process margin. This low process margin may cause a defective pattern F (e.g., a disconnection of the pattern) at any of the narrow-width sections. In the case of increasing a thickness of the bit line 18 in consideration of the bit line contact hole 16, a margin of a storage electrode contact formed in a post-process is decreased. This may cause the bit line to touch the storage electrode contact, resulting in the occurrence of a defective part in the semiconductor device.

BRIEF SUMMARY OF THE INVENTION

Various embodiments of the present invention are directed to providing a method for forming a semiconductor device that substantially obviates one or more problems due to limitations and disadvantages of the related art. The method for forming the semiconductor device prevents a defective pattern from occurring in a bit line that has different widths so as to accurately connect a bit line with a bit line contact and to increase a margin of a storage electrode contact.

In accordance with an aspect of the present invention, a semiconductor memory device includes a plurality of bit lines having substantially a uniform width over a semiconductor substrate, a plurality of an active region obliquely arranged to have a predetermined angle with respect to the bit lines, and a plurality of spacers provided on sidewalls of the bit lines. As a result, the spacer arranged around the bit line in a 6F2-layout semiconductor device prevents the width of the bit line from increasing to cover a bit line contact formed at a lower part of the bit line, such that this semiconductor device can solve the conventional problem in which a process margin is reduced due to an irregular bit line width so that the patterning is wrongly carried out.

Preferably, the semiconductor device may further include a contact pad connected to a lower part of each of the bit lines. In this case, the contact pad is electrically connected to the bit lines so as to prevent the increase of resistance between each bit line and a landing plug located at a lower part.

Preferably, the spacers are extend to an upper part of sidewalls of the contact pad. It can be recognized that the spacer are arranged around the bit line in terms of a cross-sectional view of the semiconductor device, such that the bit line having a uniform width can be easily formed.

Preferably, the semiconductor device may further include: a plurality of landing plugs contacting the semiconductor substrate; and an etch stop layer provided over the landing plugs, the contact pad extending above and below the etch stop layer.

Preferably, the semiconductor device may further include: a first interlayer insulating layer provided over the etch stop layer; and a second interlayer insulating layer provided between the landing plugs and below the first interlayer insulating layer. In this case, the etch stop layer prevents the excessive etching process from being generated when a bit line contact hole is formed, such that parts located under the etch stop layer are not etched. The second interlayer insulating layer serves as a sacrifice insulation layer used when a bit line contact hole is formed.

Preferably, the contact pad is electrically coupled to at least the landing plugs. In this case, the contact pad minimizes the increase of resistance between the landing plug and the bit line, and is then is electrically connected to the landing plug. The landing plug is formed on the active region where a channel is formed, such that a circuit wiring (e.g., a bit line or the like) formed in a post-process is electrically connected to a semiconductor substrate.

Preferably, the bit line may include tungsten. In this case, the bit line is formed of tungsten so as to facilitate high-speed operations and to increase a characteristic of resistance.

Preferably, the spacer may include a nitride layer.

Preferably, the contact pad connected to lower part of each of the bit lines, wherein the contact pad includes tungsten. The contact pad electrically connects the landing plug to the bit line as described above, such that it is preferable that the contact pad be formed of tungsten used as a constituent material of the bit line so as to prevent the increase of resistance.

Preferably, the etch stop layer may include a silicon oxide nitride (SiON) layer.

Preferably, the first interlayer insulating layer and the second interlayer insulating layer may include an oxide layer.

Preferably, the semiconductor device may include: a contact pad connected to a lower part of each of the bit lines; a plurality of landing plugs contacting the semiconductor substrate; an etch stop layer provided over the landing plugs, the contact pad extending above and below the etch stop layer; a first interlayer insulating layer provided over the etch stop layer; and a second interlayer insulating layer provided between the landing plugs and below the first interlayer insulating layer, wherein each of the first interlayer insulating layer and the second interlayer insulating layer includes an oxide layer.

In accordance with another aspect of the present invention, a method for forming a semiconductor device includes: providing a substrate having a plurality of landing plugs contacting the substrate and an etch stop layer provided over the landing plugs, and a first insulating layer over the etch stop layer; etching the first interlayer insulating layer and the etch stop layer to form a contact pad hole exposing at least one of the landing plugs; forming a contact pad in the contact pad hole, the contact pad contacting the exposed landing plug; etching the first insulating layer to form a bit line contact hole that is wider laterally than the contact pad and exposes a portion of the etch stop layer provided adjacent to the contact pad; forming a spacer at sidewalls of the bit line contact hole; and providing a conductive layer within the bit line contact hole and over the first insulating layer to form a bit line.

Preferably, the method may further include: forming a second insulating layer between the landing plugs and contacting the semiconductor substrate; and forming a third insulating layer over the landing plugs and the second insulating layer, wherein the etch stop layer is provided over the third insulating layer.

Preferably, the contact pad may extend above and below the etch stop layer.

Preferably, the etch stop layer may be configured to stop the etching during the formation of the bit line contact hole.

Preferably, a lower part of the bit line contacting the contact pad may be narrower than the contact pad. Accordingly, since the contact pad is formed in the contact pad hole, a connection margin to the bit line contact increases, thereby facilitating the electrical connection between the bit line contact and the bit line.

Preferably, the bit line contact hole may be formed using a wet etch process. Accordingly, the first interlayer insulating layer can be easily etched through the wet-etching process, and the etch stop layer is not etched using a etchant having a higher etching selectivity than the etch stop layer, so that a spacer may be formed at only sidewalls of the contact pad.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
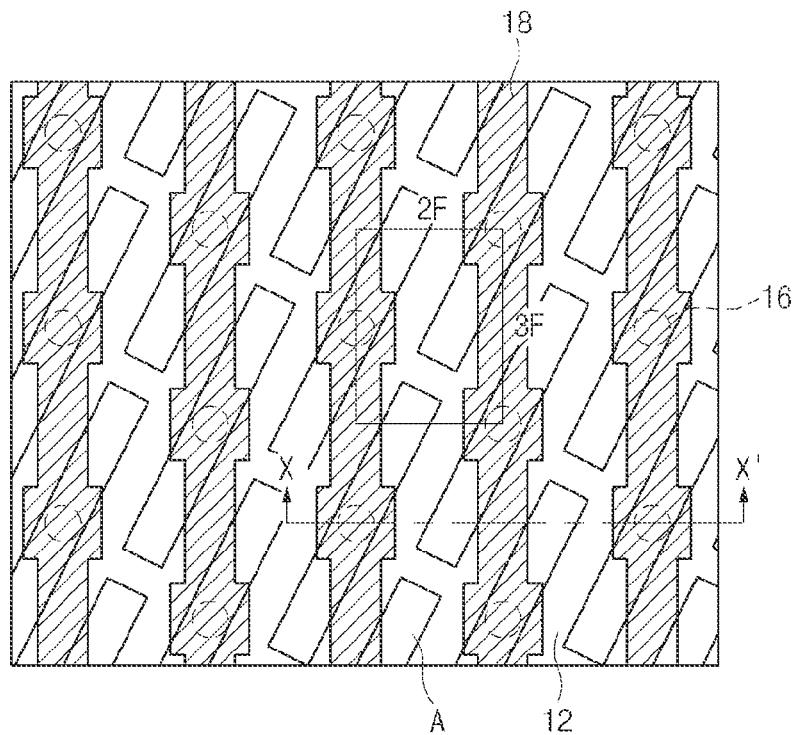
FIG. 1A is a plan view illustrating a conventional semiconductor device.
Figure 1B:
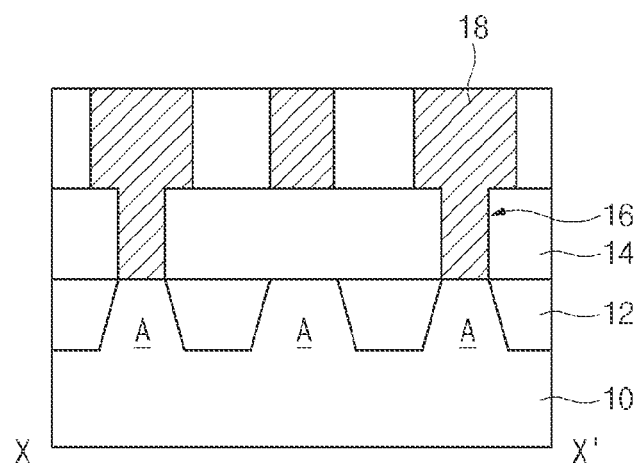
FIG. 1B is a cross-sectional view illustrating the semiconductor device taken along the line X-X' of FIG. 1A.
Figure 2:
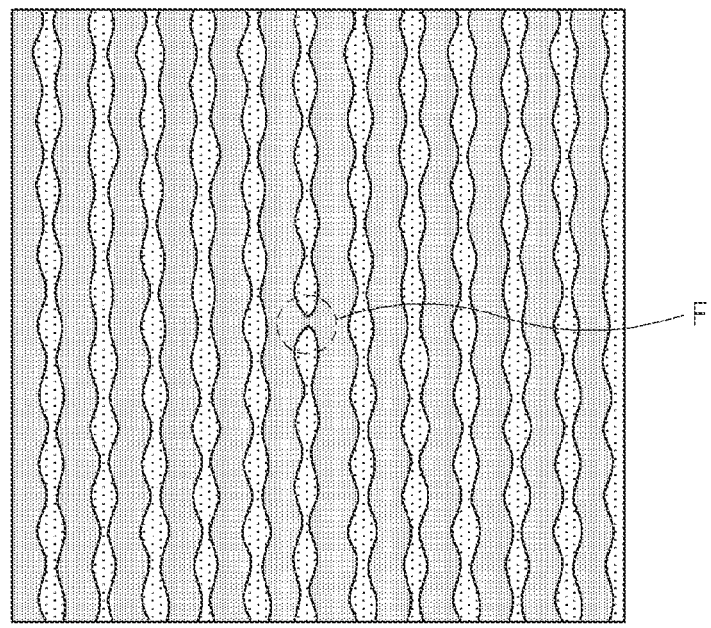
FIG. 2 illustrates a patterning image based on a bit line exposure mask according to the related art.
Figure 3A:
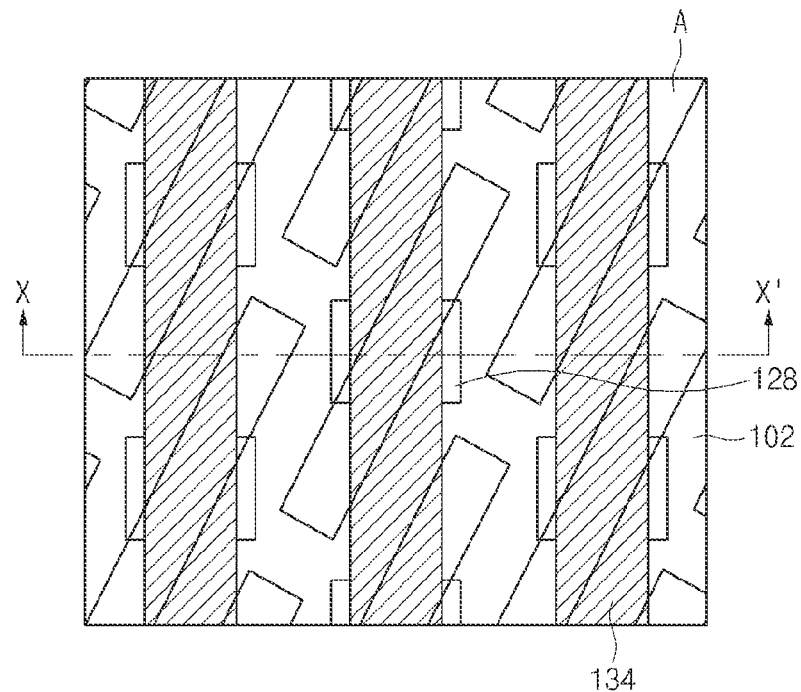
FIG. 3A is a plan view illustrating a semiconductor device according to embodiments of the present invention.
Figure 3B:
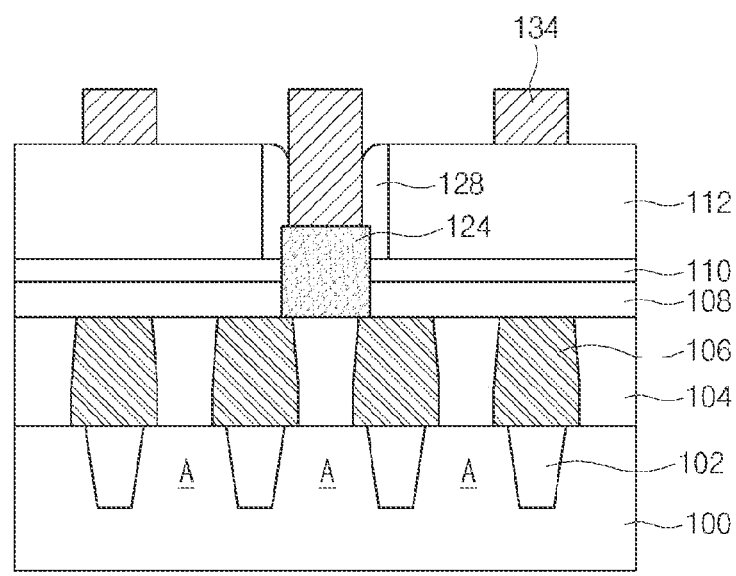
FIG. 3B is a cross-sectional view illustrating the semiconductor device taken along the line X1-X1' of FIG. 3A.

FIG. 3A is a plan view illustrating a semiconductor device according to embodiments of the present invention, and FIG. 3B is a cross-sectional view illustrating the semiconductor device taken along the line X1-X1' of FIG. 3A.

Referring to FIG. 3A, a semiconductor device according to the present invention includes a plurality of bit lines 134 having uniform widths, a plurality of active regions A obliquely arranged to have a predetermined angle with respect to the bit lines 134, and a spacer 128 arranged around the bit lines 134 connected to the center part of the active region A. In this case, the spacer 128 is formed to enclose a peripheral part of a bit line contact hole. A more detailed description thereof will hereinafter be described with reference to FIG. 3B.

Referring to FIG. 3B, the semiconductor device according to the present invention includes a landing plug 104 and an interlayer insulating layer 106 on a semiconductor substrate 100 defined by a device isolation layer 102. A word line may be further provided on the semiconductor substrate 100. An interlayer insulating layer 108 including a contact pad 124, an etch stop layer 110, and an interlayer insulating layer 112 are sequentially deposited on the landing plug 104 and the interlayer insulating layer 106. The semiconductor device further includes a spacer 128 buried between a sidewall of a contact pad and a sidewall of the interlayer insulating layer 112. In this case, the spacer 128 further buries some parts of an upper part of the contact pad 124. The spacer 128 reduces the width of a bit line to be formed in a post-process so that the patterning of a bit line is facilitated. A conductive material is deposited on the resulting structure including a space between the spacers 128, and is patterned so that a bit line 134 is formed. Accordingly, the bit lines having the same width can be easily formed.

FIGS. 4A to 4J are cross-sectional views illustrating a method for forming a semiconductor device according to embodiments of the present invention.

Figure 4A:
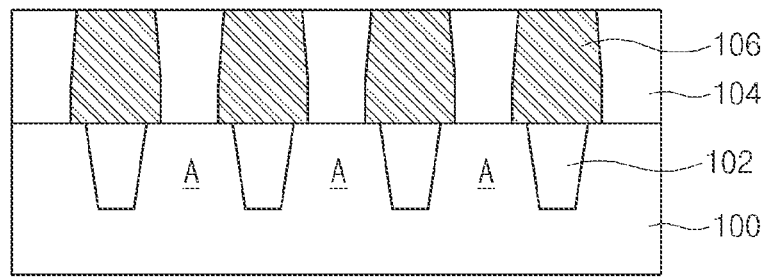
FIGS. 4A to 4J are cross-sectional views illustrating a method for forming a semiconductor device according to embodiments of the present invention.

Referring to FIG. 4A, an interlayer insulating layer 106 is formed on a semiconductor substrate 100 where an active region A defined by a device isolation layer 102 is formed. A predetermined region of the interlayer insulating layer 106 is etched to define a landing plug region (not shown). Then a conductive material is deposited to fill the landing plug region so that the landing plug 104 is formed. In this case, more word lines (not shown) may be further formed before the interlayer insulating layer 106 is formed.

Figure 4B:
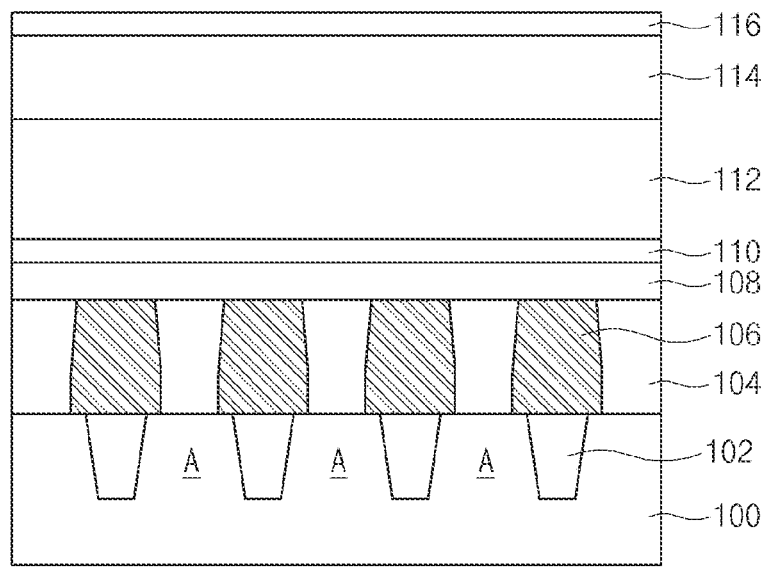

Referring to FIG. 4B, an interlayer insulating layer 108, an etch stop layer 110, an interlayer insulating layer 112, and hard mask layers 114 and 116 are formed on the resulting structure including both the interlayer insulating layer 106 and the landing plug 104. In this case, in a subsequent process, the interlayer insulating layer 112 is etched using a difference in etching selectivity between the interlayer insulating layer 112 and the etch stop layer 110. The interlayer insulating layers 108 and 112 may be formed of an oxide layer and the etch stop layer 110 may be formed of a silicon oxide nitride layer (SiON) layer. The hard mask layer 114 may be formed of an amorphous carbon (a-carbon) layer and the other hard mask layer 116 may be formed of an oxide layer.

Figure 4C:
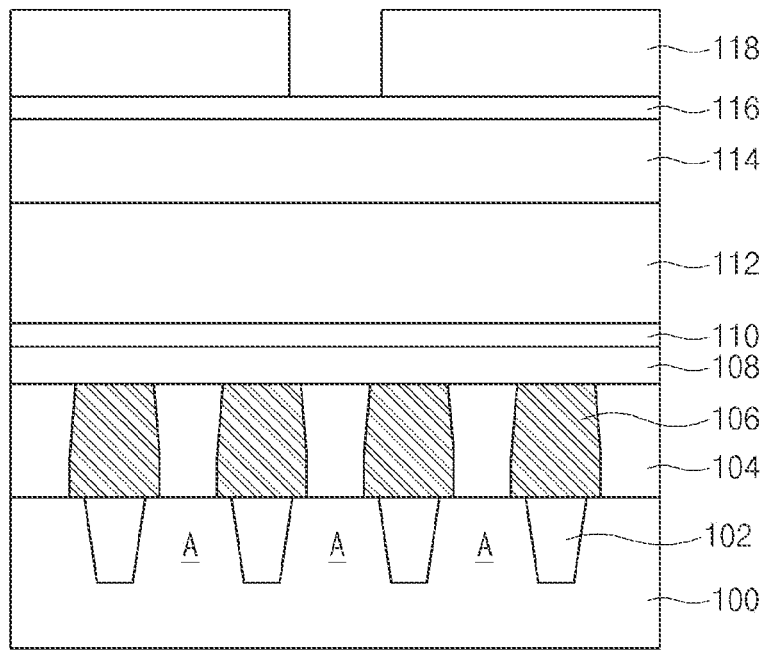
Figure 4D:
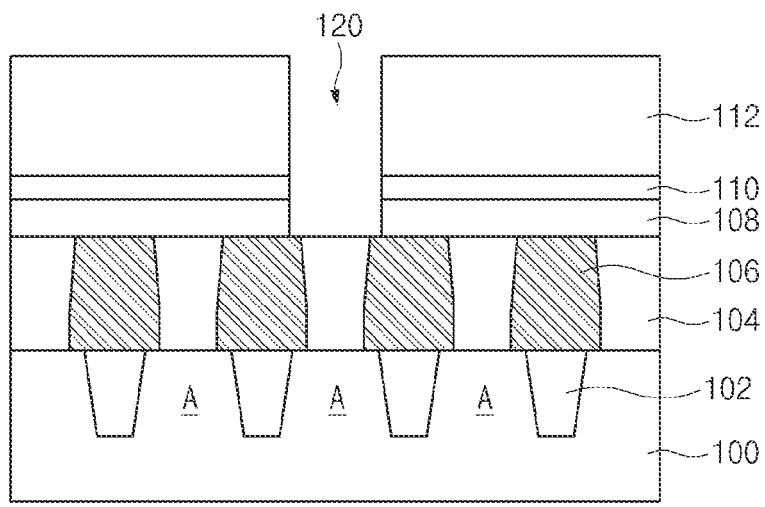

Referring to FIGS. 4C and 4D, a photoresist layer (not shown) is deposited on the hard mask layer 116, and a photoresist pattern 118 is formed by an exposure and development process using an exposure mask defining a contact pad (FIG. 4C). The hard mask layers 116 and 114, the interlayer insulating layer 112, the etch stop layer 110, and the interlayer insulating layer 108 are etched using the photoresist pattern 118 as an etch mask so as to expose the landing plug 104. This forms the contact pad hole 120. Then, the hard mask layers 116 and 114 are removed (FIG. 4D).

Figure 4E:
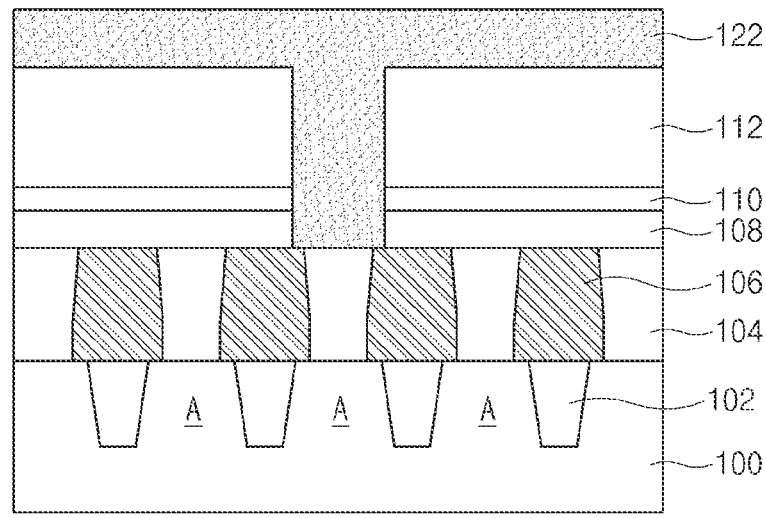
Figure 4F:
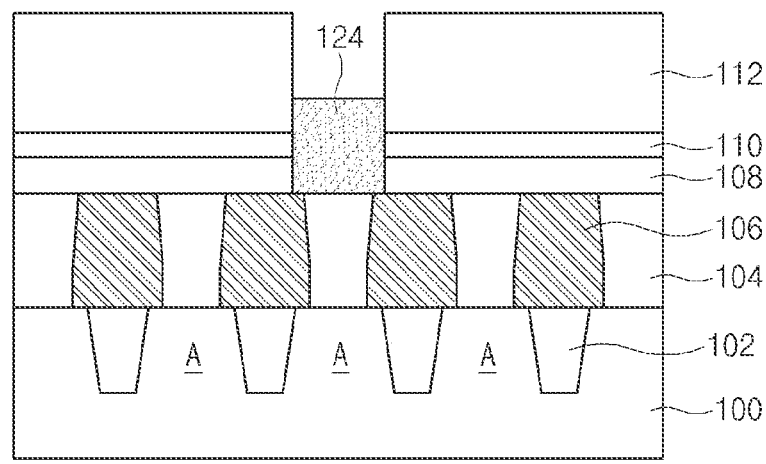

Referring to FIGS. 4E to 4F, a conductive material 122 is formed to fill the contact pad hole 120 (FIG. 4E). An etch-back process is performed on the conductive material 122 to remove an upper part of the conductive material 122, and thus a bit line contact pad 124 is formed in the contact pad hole 120 (FIG. 4F). In this case, the contact pad 124 electrically connects the landing plug to the bit line as previously stated above and so the contact pad 124 may be formed of tungsten to prevent an increase in resistance. Prior to forming the conductive material 122, a barrier metal layer (not shown) may be further formed in the contact pad hole 120.

Figure 4G:
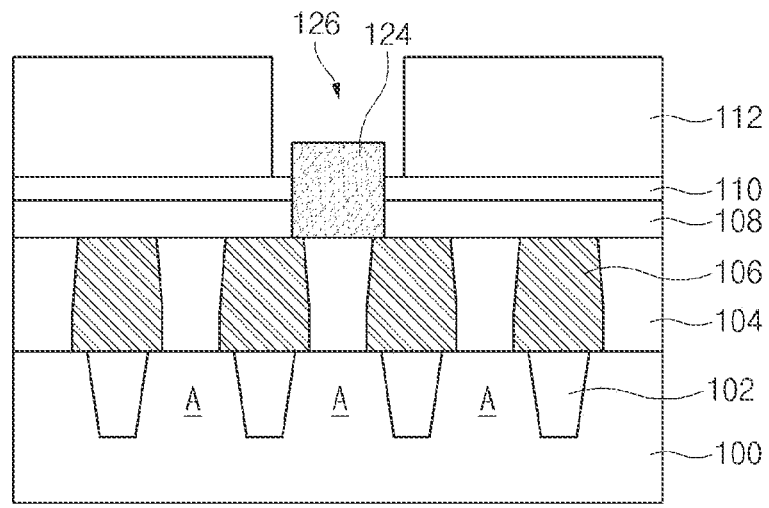

Referring to FIG. 4G, a wet etching process is performed on the interlayer insulating layer 112 so that a bit line contact hole 126 is defined. In this case, the wet etching process is stopped by the etch stop layer 110, so that only a top portion (above the etch stop layer 110) of the contact pad 124 is exposed. In this case, the bit line contact hole 126 is formed to have a larger CD (critical dimension) than the contact pad 124.

Figure 4H:
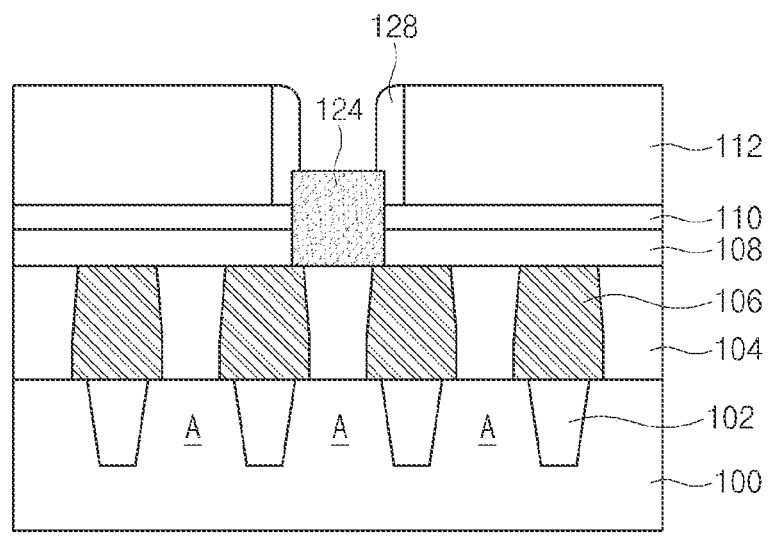

Referring to FIG. 4H, an insulation layer is deposited on an overall upper part including the contact pad 124, an etch-back process is performed on the insulation layer so as to form a spacer 128, so that a space between the contact pad 124 and the interlayer insulating layer 112 is filled. The spacer 128 may be formed of a nitride layer, the etch-back of which is easily carried out. In this case, the spacer 128 prevents bit lines (to be formed in a post-process) from being formed with irregular widths according to the presence or absence of the bit line contact hole in the same manner as in the related art. In other words, the spacer 128 of FIG. 4H is implemented with a small width instead of a large width described in the related art, and at the same time prevents the bit line contact from being exposed or prevents the bit line contact from being bridged with a storage electrode contact to be formed in a post-process. Therefore, according to embodiments of the present invention, the bit lines may have the same width irrespective of the presence or absence of a bit line contact hole.

Figure 4I:
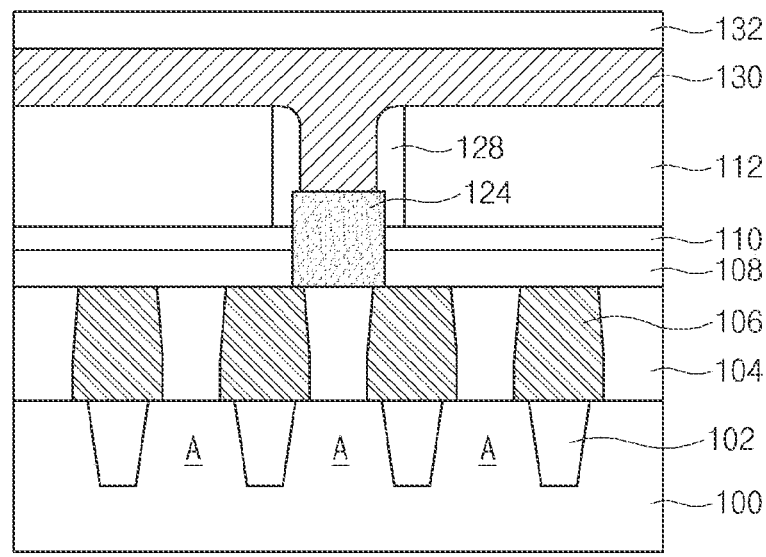
Figure 4J:
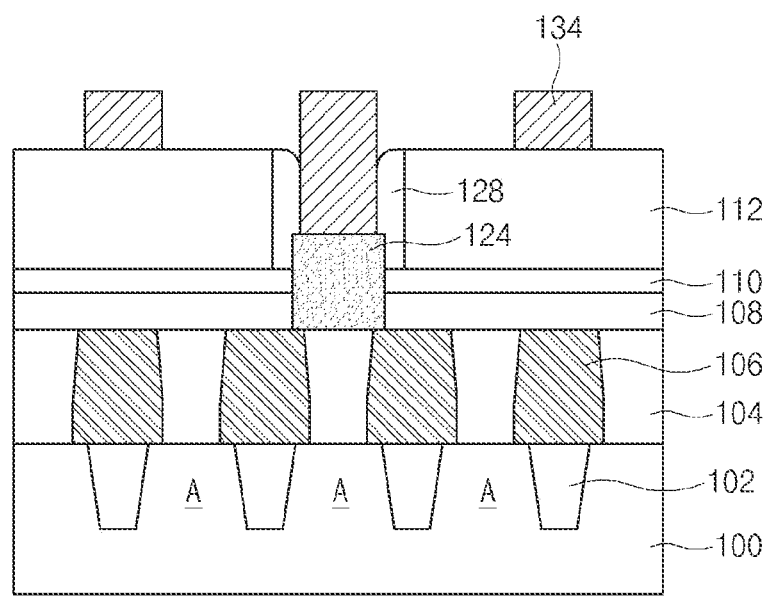

Referring to FIGS. 4I to 4J, a conductive material 130 is formed on an overall upper part including a bit line contact hole 126, and a hard mask layer 132 is formed on the conductive material 130, so that a bit line contact hole 126 is filled (FIG. 4I). The conductive material 130 is formed of tungsten so as to facilitate high-speed operation and to decrease resistance. Thereafter, a photoresist layer (not shown) is deposited on a hard mask layer 13 and patterned for defining the bit line through an exposure and development process using a bit line mask. The hard mask layer 132 and the conductive material 130 are etched using the photoresist pattern as an etching mask, so that bit lines 134 is formed (FIG. 4I). In this case, the bit lines 134 are formed to have the same width irrespective of the presence or absence of the bit line contact hole 126. Therefore, when forming the bit line 134, a process margin increases defective parts can be prevented.

As apparent from the above description, the above-mentioned semiconductor device and the method for forming the same according to embodiments of the present invention use a mask pattern having the same or regular width as a bit line mask, so that a process margin greatly increases as compared to the related art, resulting in no defective patterning parts.

The semiconductor device and the method for forming the same according to embodiments of the present invention have the following effects.

First, a CD (critical dimension) of the bit line contact increases, so that a bit line contact patterning margin also increases. Second, a bit line pattern having a uniform width is formed so that a patterning margin increases. Third, a storage electrode contact self-alignment margin increases so that a line-type storage electrode contact margin increases. Fourth, a bit line and a storage electrode contact are configured in the form of a predetermined line, so that a spacer patterning (SPT) process is made available. Fifth, the bit lines having the same width are easily formed using a tungsten etch-back process and a wet-etching process that are currently applied to a current fabrication process.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
  a bit line having a substantially uniform width over a semiconductor substrate;
  an active region obliquely arranged at a predetermined angle with respect to the bit line; and
  a spacer provided over a sidewall of the bit line,
  wherein a width of the bit line is smaller than a width of a contact pad coupled to a lower portion of the bit line.

2. The semiconductor device according to claim 1, wherein the spacer extends to an upper part of a sidewall of the contact pad.

3. The semiconductor device according to claim 1, the device further comprising:
a landing plug contacting the semiconductor substrate.

4. The semiconductor device according to claim 3, the device further comprising:
a first interlayer insulating layer provided over a lower portion of a sidewall of the contact pad,
a second interlayer insulating layer provided over an upper portion of the sidewall of the contact pad, and
an etch stop layer provided between the first and the second interlayer insulating layers and coupled to the sidewall of the contact pad.

5. The semiconductor device according to claim 1, the device further comprising:
a contact pad coupled to a lower portion of the bit line, wherein the contact pad includes tungsten.

6. The semiconductor device according to claim 3, wherein the contact pad is electrically coupled to the landing plug.

7. The semiconductor device according to claim 1, wherein the bit line includes tungsten.

8. The semiconductor device according to claim 1, wherein the spacer includes a nitride layer.

9. The semiconductor device according to claim 4, wherein the etch stop layer includes a silicon oxide nitride (SiON) layer.

10. The semiconductor device according to claim 4, wherein each of the first interlayer insulating layer and the second interlayer insulating layer includes an oxide layer.

11. The semiconductor device according to claim 1, further comprising:
a landing plug contacting the semiconductor substrate;
a first interlayer insulating layer provided over a lower portion of a sidewall of the contact pad;
a second interlayer insulating layer provided over an upper portion of the sidewall of the contact pad;
wherein each of the first interlayer insulating layer and the second interlayer insulating layer includes an oxide layer.

12. The semiconductor device according to claim 11, the device further comprising:
an etch stop layer provided between the first and the second interlayer insulating layers and coupled to the sidewall of the contact pad.

13. The semiconductor device according to claim 1,
wherein the semiconductor substrate includes an active region and a device isolation region,
wherein the bit line extends across the active region and the device isolation region, and
wherein a width of the bit line is substantially the same in the active region and in the device isolation region.

14. The semiconductor device according to claim 13,
wherein the bit line has a substantially uniform width with respect to a direction extending from a top of the bit to a bottom of the bit line.

15. The semiconductor device according to claim 1,
wherein the spacer extends from over a sidewall of the bit line to over a sidewall of the contact pad.

* * * * *